(12) United States Patent
Coley et al.

(10) Patent No.: US 10,818,493 B2
(45) Date of Patent: Oct. 27, 2020

(54) SILICON-BASED HARDMASK

(71) Applicant: Rohm and Haas Electronic Materials LLC, Marlborough, MA (US)

(72) Inventors: Suzanne M. Coley, Mansfield, MA (US); Paul J. LaBeaume, Auburn, MA (US); Shintaro Yamada, Shrewsbury, MA (US); Cecilia W. Kiarie, Shrewsbury, MA (US); Li Cui, Westborough, MA (US); Bhooshan Popere, Marlborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 16/218,519

(22) Filed: Dec. 13, 2018

(65) Prior Publication Data

US 2019/0115209 A1    Apr. 18, 2019

Related U.S. Application Data

(62) Division of application No. 15/622,220, filed on Jun. 14, 2017, now Pat. No. 10,186,424.

(51) Int. Cl.
| | |
|---|---|
| *H01L 21/027* | (2006.01) |
| *C08G 77/04* | (2006.01) |
| *G03F 7/09* | (2006.01) |
| *C09D 7/20* | (2018.01) |
| *C08G 77/50* | (2006.01) |
| *C09D 183/14* | (2006.01) |
| *G03F 7/075* | (2006.01) |
| *C09D 5/00* | (2006.01) |
| *C08G 77/00* | (2006.01) |

(52) U.S. Cl.
CPC .......... *H01L 21/0276* (2013.01); *C08G 77/04* (2013.01); *C08G 77/50* (2013.01); *C09D 5/006* (2013.01); *C09D 7/20* (2018.01); *C09D 183/14* (2013.01); *G03F 7/0752* (2013.01); *G03F 7/091* (2013.01); *G03F 7/094* (2013.01); *C08G 77/80* (2013.01)

(58) Field of Classification Search
CPC .................................................. H01L 21/0276
See application file for complete search history.

(56) References Cited

U.S. PATENT DOCUMENTS

| | | |
|---|---|---|
| 6,147,156 A | 11/2000 | Yamaya et al. |
| 8,524,851 B2 | 9/2013 | Kim et al. |
| 9,140,986 B2 | 9/2015 | Kim et al. |
| 2005/0277058 A1 | 12/2005 | Iwabuchi et al. |
| 2008/0090986 A1 | 4/2008 | Khanarian et al. |
| 2010/0252917 A1 | 10/2010 | Karkkainen |
| 2012/0146088 A1 | 6/2012 | Tanikawa et al. |

OTHER PUBLICATIONS

Search report for corresponding Taiwan Application No. 107228808 dated Dec. 5, 2018.

*Primary Examiner* — Mohammad M Choudhry
(74) *Attorney, Agent, or Firm* — Jonathan D. Baskin

(57) ABSTRACT

Compositions for forming thin, silicon-containing antireflective coatings and methods of using these compositions in the manufacture of electronic devices are provided. Silicon-containing antireflective coatings formed from the these compositions can be easily removed during processing without the need for a separate removal step.

11 Claims, 2 Drawing Sheets

*Fig. 1 – Prior Art*

SILICON-BASED HARDMASK

This application is a divisional of U.S. supplication Ser. No. 15/622,220, filed on Jun. 14, 2017, now allowed.

The present invention relates generally to the field of semiconductor device manufacture and more particularly to silicon-based hardmasks used in the manufacture of semiconductor devices.

In conventional photolithographic processes, the resist pattern is used as a mask for pattern transfer to the substrate by suitable etching processes, such as by reactive ion etch (RIE). The continued decrease in the thickness of the resist used makes the resist pattern unsuitable as a mask for pattern transfer by RIE processes. As a result, alternate processes have been developed using three, four or more layers as a mask for pattern transfer. For example, in a trilayer process a silicon-containing antireflective layer is disposed between an underlayer/organic planarizing layer and the resist layer. Due to the alternating selectivity towards fluorine and oxygen-containing RIE chemistry these layers possess, this trilayer scheme provides highly selective pattern transfer from the resist pattern on top of the Si-containing layer into the substrate below the underlayer.

The process flow of part of a conventional trilayer process is illustrated in FIG. 1, where structure 1a is a device cross-section, not to scale, showing, in order, patterned photoresist layer 25 having opening 26 disposed on siloxane antireflective layer 20, which is disposed on a high carbon-content antireflective coating layer 15, which is disposed on semiconductor device substrate 10. Structure 1a is subjected to a first pattern transfer step such as a fluorine etch step, in which opening 26 is transferred to the siloxane antireflective layer to provide patterned siloxane antireflective layer 21 as shown in structure 1b. Next, structure 1c is obtained by subjecting structure 1b to a second pattern transfer step such as an oxide etch to transfer opening 26 into the high carbon-content antireflective coating layer to provide patterned high carbon-content antireflective coating layer 16, with the removal of at least a portion of patterned photoresist layer 25. A third pattern transfer step is used to transfer opening 26 into substrate 11 as shown in structure 1d. Remaining patterned siloxane antireflective layer 21 is then removed by a separate process step to provide structure 1e, followed by removal of the patterned high carbon-content antireflective layer 16 to provide a patterned substrate, not shown. The semiconductor industry is moving toward the use of reduced photoresist film thicknesses for higher resolution. Such reduced photoresist film thickness is driving the reduction in other film thicknesses, such as silicon-containing antireflective layers. There is a need in the industry for silicon-containing antireflective materials that can be used to form relatively thinner films while maintain their antireflective effectiveness, and reduce damage to the photoresist layer when the silicon-containing antireflective layer is patterned.

Provided by the present invention are organosiloxane polymers comprising as polymerized units one or more first silane monomers having a $C_{2-20}$ unsaturated hydrocarbyl moiety and a condensable silicon-containing moiety; one or more second silane monomers having two or more silicon-containing moieties joined by a $C_{2-30}$ unsaturated linking group moiety wherein at least one of the silicon-containing moieties is a condensable silicon-containing moiety; and one or more third silane monomers having a chromophore moiety and a condensable silicon-containing moiety.

Also provided by the present invention is an organosiloxane polymer of formula (4):

$$\{(R^{10}SiO_{1.5})_m(SiO_{1.5}\text{-}LG\text{-}SiO_{1.5})_n(ChSiO_{1.5})_o\}(OR^{11})_p \quad (4)$$

wherein $R^{10}$ is a $C_{2-20}$ unsaturated hydrocarbyl moiety; each $R^{11}$ group is independently H, $C_{1-6}$ alkyl, or $C_{1-6}$ acyl; LG is a $C_{2-30}$ unsaturated linking group moiety; Ch is a $C_{5-30}$ chromophore moiety having one or more aromatic rings; $0.01 \leq m \leq 0.75$; $0.2 \leq n \leq 0.95$; $0.01 \leq o \leq 0.75$; $0.01 \leq p \leq 0.99$; and $m+n+o=1$.

Additionally, the present invention provides a composition comprising one or more of the above described organosiloxane polymers and one or more organic solvents.

Further, the present invention provides a process for producing a semiconductor device, comprising: providing a semiconductor device substrate having a carbon-based hardmask layer; coating a layer of the composition described above on the carbon-based hardmask layer to form an organosiloxane antireflective layer; coating a layer of a photoresist on the siloxane antireflective layer; patterning the photoresist layer to form a pattern; transferring the pattern to the siloxane antireflective layer to form a patterned siloxane antireflective layer; transferring the pattern from the patterned siloxane antireflective layer to the carbon-based hardmask layer to form a patterned carbon-based hardmask layer; and transferring the pattern from the patterned carbon-based hardmask layer to the semiconductor device substrate, wherein the patterned siloxane antireflective layer is substantially, preferably completely, removed during the step of transferring the pattern to the semiconductor device substrate.

Figure 1:
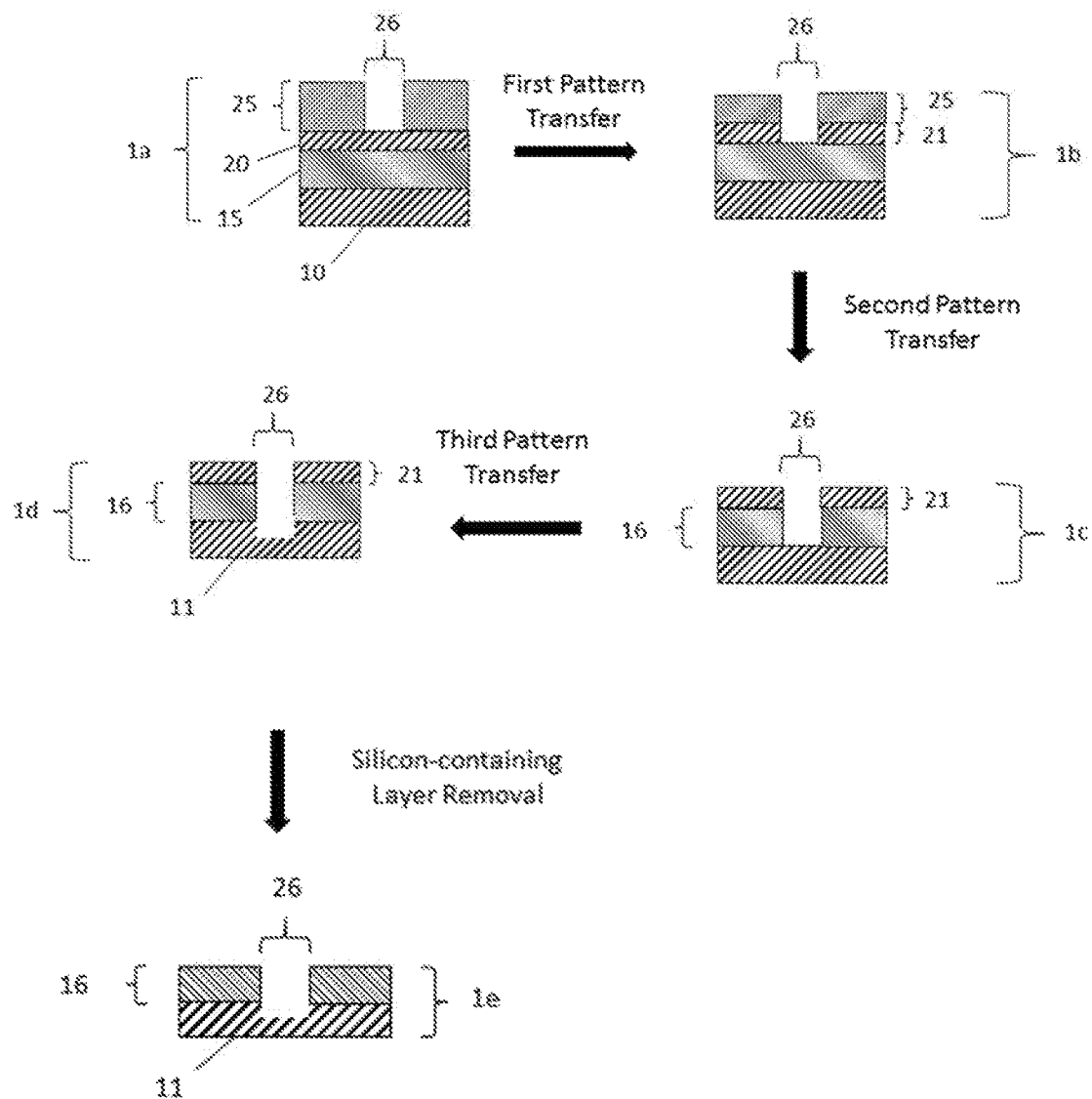
FIG. 1 is a cross-sectional illustration of certain steps of a trilayer process used in the manufacture of a semiconductor device.

It will be understood that when an element is referred to as being "adjacent" to or "on" another element, it can be directly adjacent to or on the other element or intervening elements may be present therebetween. In contrast, when an element is referred to as being "directly adjacent" or "directly on" another element, there are no intervening elements present. It will be understood that although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; mg=milligram; ppm=part per million by weight unless otherwise noted; μm=micron=micrometer; nm=nanometer; Å=angstrom; L=liter; mL=milliliter; sec.=second; min.=minute; hr.=hour; and Da=dalton. All amounts are percent by weight ("wt %") and all ratios are molar ratios, unless otherwise noted. All numerical ranges are inclusive and combinable in any order, except where it is clear that such numerical ranges are constrained to add up to 100%. Percent by weight is based on the total weight of a referenced composition, unless otherwise noted. The articles "a", "an" and "the" refer to the singular and the plural, unless it is clear from the context that such article refers to the singular. As used herein, the term "and/or" includes any and all combinations of one or more of the associated listed items. $M_w$ refers to weight average molecular weight and is determined by gel permeation chromatography (GPC) using polystyrene standards.

As used throughout the specification, the term "alkyl" includes linear, branched and cyclic alkyl. The term "alkyl" refers to an alkane radical, and includes alkane monoradicals, diradicals (alkylene), and higher-radicals if the context so indicates. If no number of carbons is indicated for any alkyl or heteroalkyl, then 1-12 carbons are contemplated. The term "alkenyl" refers to an alkene radical which may have one or more carbon-carbon double bonds, and includes alkene monoradicals, diradicals (alkenylene), and higher-radicals if the context so indicates. "Alkenyl" refers to linear, branched and cyclic alkene radicals unless otherwise specified. The term "alkynyl" refers to an alkyne radical, which may have one or more carbon-carbon triple bonds, and includes alkyne monoradicals, diradicals, and higher-radicals if the context so indicates. "Alkynyl" refers to linear and branched alkyne radicals. If no number of carbons is indicated for any alkenyl or alkynyl, then 2-12 carbons are contemplated. By the term "curing" is meant any process, such as polymerization or condensation, that increases the molecular weight of a material or composition. "Curable" refers to a material capable of being cured under the stated conditions, such as by condensation. The term "oligomer" refers to dimers, trimers, tetramers and other relatively low molecular weight materials that are capable of further curing. The term "polymer" includes oligomers and refers to homopolymers, copolymers, terpolymers, tetrapolymers and the like.

Compositions useful in the present invention comprise an organosiloxane polymer, which is curable. As used herein, the term "organosiloxane polymer" refers to a condensate and/or hydrolyzate of two or more silane monomers. The present organosiloxane polymers comprise as polymerized units one or more first silane monomers having a $C_{2-20}$ unsaturated hydrocarbyl moiety and a condensable silicon-containing moiety; one or more second silane monomers having two or more silicon-containing moieties joined by a $C_{2-30}$ unsaturated linking group moiety wherein at least one of the silicon-containing moieties is a condensable silicon-containing moiety; and one or more third silane monomers having a chromophore moiety and a condensable silicon-containing moiety. The silane monomers are different from each other. Each of the first and third silane monomers has one condensable silicon-containing moiety and the second silane monomer has two or more silicon-containing moieties wherein at least one of the silicon-containing moieties is a condensable silicon-containing moiety. The term "condensable silicon-containing moieties" refers to silicon-containing moieties that can be condensed or hydrolyzed in the presence of aqueous base or aqueous acid. Suitable condensable silicon-containing moieties have from one to three silicon substituents chosen from halogen, hydroxy, $C_{1-6}$ alkoxy, and $C_{1-6}$ acyloxy, and preferably chosen from hydroxy, $C_{1-6}$ alkoxy, and $C_{1-6}$ acyloxy.

First silane monomers of the invention have a $C_{2-20}$ unsaturated hydrocarbyl moiety and a condensable silicon-containing moiety. The term "unsaturated hydrocarbyl moiety" refers to a linear, branched or cyclic non-aromatic hydrocarbyl moiety having carbon-carbon unsaturation, and which may optionally contain one or more heteroatoms, such as oxygen, nitrogen, silicon, and phosphorus, in the hydrocarbyl chain in addition to carbon. As used herein, the term "unsaturated hydrocarbyl moiety" does not refer to aromatic unsaturation. The $C_{2-20}$ unsaturated hydrocarbyl moiety of the first silane monomer has one or more non-aromatic unsaturated carbon-carbon bonds, that is, one or more carbon-carbon double bonds and/or carbon-carbon triple bonds. Preferred unsaturated hydrocarbyl moieties are unsubstituted or substituted unsaturated aliphatic moieties, which may be linear, branched or cyclic. When an unsaturated hydrocarbyl moiety contains two or more alicyclic rings, such alicyclic rings may be isolated, fused or spirocyclic. Alicyclic unsaturated hydrocarbyl moieties include single alicyclic rings, such ascyclopentenyl, cyclopentadienyl, cyclohexenyl, and cyclohexadienyl, as well as bicyclic rings, such as dicyclopentadienyl and norbornenyl. As used herein, "unsaturated aliphatic moiety" includes unsaturated aliphatic moieties having one or more heteroatoms such as oxygen, nitrogen, silicon, and phosphorus, and preferably oxygen or nitrogen. By "substituted unsaturated aliphatic moiety" is meant any unsaturated aliphatic moiety having one or more of its hydrogens replaced with one or more substituents chosen from halo, cyano, $C_{1-10}$ alkoxy, $C_{1-10}$ acyl, and $C_{1-10}$ acyloxy, and L-$C_{2-20}$ unsubstituted aliphatic, wherein L is a divalent linking group chosen from —C(=O)—, —C(=O)O—, and —O—C(=O)—. Preferably, the first silane monomer has an unsubstituted $C_{2-15}$ unsaturated hydrocarbyl moiety, more preferably an unsubstituted $C_{2-15}$ unsaturated aliphatic moiety having from 0 to 3 heteroatoms chosen from oxygen and nitrogen or a $C_{2-15}$ unsaturated aliphatic moiety having from 0 to 3 heteroatoms chosen from oxygen and nitrogen and being substituted with one or more substituents chosen from halo, cyano, $C_{1-10}$ alkoxy, $C_{1-10}$ acyl, and $C_{1-10}$ aryloxy, and L-$C_{2-20}$ unsubstituted aliphatic, wherein L is a divalent linking group chosen from —C(=O)—, —C(=O)O—, and —O—C(=O)—, and more preferably an unsubstituted $C_{2-15}$ unsaturated aliphatic moiety having from 0 to 3 heteroatoms chosen from oxygen and nitrogen. Preferably, the $C_{2-20}$ unsaturated hydrocarbyl moiety is a substituted or unsubstituted $C_{2-20}$ alkenyl or $C_{2-20}$ alkynyl, more preferably an unsubstituted $C_{2-20}$ alkenyl or $C_{2-20}$ alkynyl, yet more preferably an unsubstituted $C_{2-15}$ alkenyl or $C_{2-15}$ alkynyl, and even more preferably an unsubstituted $C_{2-15}$ alkenyl. "Substituted $C_{2-20}$ alkenyl" and "substituted $C_{2-20}$ alkynyl" refer to a $C_{2-20}$ alkenyl and $C_{2-20}$ alkynyl, respectively, having one or more of its hydrogens replaced with one or more substituents chosen from halo, cyano, $C_{1-10}$ alkoxy, $C_{1-10}$ acyl, and $C_{1-10}$ acyloxy, and L-$C_{2-20}$ unsubstituted aliphatic, wherein L is a divalent linking group chosen from —C(=O)—, —C(=O)O—, and —O—C(=O)—.

Suitable first silane monomers are those of formula (1):

$$(R^1)_a(R^2)_b Si(R^3)_{4-(a+b)} \quad (1)$$

wherein each $R^1$ is independently a $C_{2-20}$ unsaturated hydrocarbyl moiety; each $R^2$ is independently a $C_{1-12}$ alkyl; each $R^3$ is independently chosen from halogen, hydroxyl, $C_{1-6}$ alkoxy and $C_{1-6}$ acyloxy; a=1 to 3; and b=0 to 2. It is preferred that each $R^1$ is chosen from an unsubstituted $C_{2-20}$ unsaturated aliphatic moiety, a $C_{2-20}$ unsaturated aliphatic moiety substituted with one or more of halo, cyano, $C_{1-10}$ alkoxy, $C_{1-10}$ acyl, and $C_{1-10}$ acyloxy, and L-$C_{2-20}$ unsubstituted aliphatic, wherein L is a divalent linking group chosen from —C(=O)—, —C(=O)O—, and —O—C(=O)—. More preferably, each $R^1$ is chosen from an unsubstituted $C_{2-12}$ unsaturated aliphatic moiety, a substituted $C_{2-12}$ unsaturated aliphatic moiety, and L-$C_{2-12}$ unsubstituted aliphatic, wherein L is a divalent linking group chosen from —C(=O)—, —C(=O)O—, and —O—C(=O)—, and yet more preferably is an unsubstituted $C_{2-12}$ unsaturated aliphatic moiety. Alternatively, it is preferred that each R' is chosen from a substituted or unsubstituted $C_{2-12}$ alkenyl, $C_{2-12}$ alkynyl, and L-$C_{2-12}$ unsubstituted aliphatic, wherein L is a divalent linking group chosen from —C(=O)—, —C(=O)O—, and —O—C(=O)—, and more preferably an unsubstituted $C_{2-12}$ alkenyl and $C_{2-12}$ alkynyl. Each $R^2$ is preferably chosen from $C_{1-10}$ alkyl, and more preferably is $C_{1-8}$ alkyl. Each $R^3$ is preferably chosen from hydroxyl, $C_{1-6}$ alkoxy and $C_{1-6}$ acyloxy, more preferably from hydroxyl and $C_{1-6}$ alkoxy, and yet more preferably from $C_{1-4}$ alkoxy. Preferably, a=1. It is preferred that b=0. It is further preferred that a=1 and b=0. The $C_{2-12}$ unsaturated hydrocarbyl moiety of $R^1$ is free of substitution by a condensable silicon-containing moiety.

Exemplary first silane monomers include, without limitation: vinyl trimethoxysilane, vinyl triethoxysilane, vinyl triacetoxy silane, vinyl methyl dimethoxysilane, vinyl methyl diethoxysilane, vinyl ethyl diethoxysilane, allyl trimethoxysilane, allyl triethoxysilane, buta-1,3-dien-1-yl trimethoxysilane, buta-1,3-dien-1-yl triethoxysilane, divinyl dimethoxysilane, divinyl diethoxysilane, diallyl dimethoxysilane, diallyl diethoxysilane, ethynyl trimethoxysilane, ethynyl triethoxysilane, ethynyl triacetoxysilane, propargyl trimethoxysilane, propargyl triethoxysilane, diethynyl dimethoxysilane, diethynyl diethoxysilane, dipropargyl dimethoxysilane, ethynyl methyl dimethoxysilane, propargyl methyl dimethoxysilane, acryloyl trimethoxysilane, acryloyl triethoxysilane, methacryloyl trimethoxysilane, methacryloyl triethoxysilane, crotonoyl trimethoxysilane, crotonoyl triethoxysilane, angeloyl trimethoxysilane, angeloyl triethoxysilane, 1-(trimethoxysilyl)prop-2-ene-1-one, 1-(trimethoxysilyl)but-3-ene-1-one, and the like. Preferred first silane monomers are vinyl trimethoxysilane, vinyl triethoxysilane, vinyl triacetoxy silane, vinyl methyl dimethoxysilane, vinyl methyl diethoxysilane, vinyl ethyl diethoxysilane, allyl trimethoxysilane, allyl triethoxysilane, divinyl dimethoxysilane, divinyl diethoxysilane, diallyl dimethoxysilane, and diallyl diethoxysilane, and more preferably vinyl trimethoxysilane, vinyl triethoxysilane, vinyl triacetoxy silane, allyl trimethoxysilane, and allyl triethoxysilane.

Second silane monomers have two or more silicon-containing moieties joined by a $C_{2-30}$ unsaturated linking group moiety wherein at least one of the silicon-containing moieties is a condensable silicon-containing moiety. Preferably, the second silane monomer has two or more condensable silicon-containing moieties, and more preferably two condensable silicon-containing moieties. The two or more condensable silicon-containing moieties in the second monomer may be the same or different, and preferably are the same. The $C_{2-30}$ unsaturated linking group moiety has carbon-carbon unsaturation, which may be aromatic unsaturation, non-aromatic unsaturation, or both aromatic and non-aromatic unsaturation. Preferably, the $C_{2-30}$ unsaturated linking group moiety has non-aromatic unsaturation, or a combination of non-aromatic unsaturation and aromatic unsaturation, and more preferably only non-aromatic unsaturation. The $C_{2-30}$ unsaturated linking group moiety has one or more sites of carbon-carbon unsaturation, that is, a carbon-carbon double bond and/or a carbon-carbon triple bond. When the $C_{2-30}$ unsaturated linking group moiety has one or more carbon-carbon double bonds, such double bonds may have either a cis or trans configuration. While not wishing to be bound by theory, it is believed that a $C_{2-30}$ unsaturated linking group moiety having a carbon-carbon double bond having a cis configuration has a lower index of refraction and a lower optical absorption as compared to the same $C_{2-30}$ unsaturated linking group moiety having a carbon-carbon double bond having a trans configuration. The unsaturated linking group moiety may be substituted or unsubstituted, and preferably is unsubstituted. The unsaturated linking group moiety may have one or more heteroatoms such as oxygen, nitrogen, silicon, and phosphorus, and preferably oxygen or nitrogen. By "substituted unsaturated linking group moiety" is meant any unsaturated linking group moiety having one or more of its hydrogens replaced with one or more substituents chosen from halo, cyano, $C_{1-10}$ alkyl, $C_{2-10}$ alkenyl, $C_{2-10}$ alkynyl, $C_{1-10}$ alkoxy, $C_{1-10}$ acyl, $C_{1-10}$ acyloxy, $C_{5-20}$ aryl, and $C_{5-20}$ aryloxy. Preferably, the unsaturated linking group moiety is chosen from an unsubstituted $C_{2-12}$ unsaturated aliphatic moiety and a $C_{2-12}$ unsaturated aliphatic moiety substituted with one or more of halo, cyano, $C_{1-10}$ alkyl, $C_{2-10}$ alkenyl, $C_{2-10}$ alkynyl, $C_{1-10}$ alkoxy, $C_{1-10}$ acyl, $C_{1-10}$ acyloxy, $C_{5-20}$ aryl, and $C_{5-20}$ aryloxy, and more preferably an unsubstituted $C_{2-12}$ unsaturated aliphatic moiety. Preferably, the $C_{2-12}$ unsaturated linking group moiety is a substituted or unsubstituted $C_{2-12}$ alkenyl or $C_{2-12}$ alkynyl, more preferably an unsubstituted $C_{2-12}$ alkenyl or $C_{2-12}$ alkynyl, and yet more preferably $C_{2-12}$ alkenyl. The second silane monomers are different from the first and third silane monomers.

Suitable second silane monomers are those of formula (2):

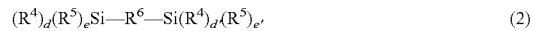

$$(R^4)_d(R^5)_e Si-R^6-Si(R^4)_{d'}(R^5)_{e'} \qquad (2)$$

wherein each $R^4$ is independently chosen from $C_{1-12}$ alkyl, $C_{2-12}$ alkenyl, $C_{2-12}$ alkynyl, and $C_{5-30}$ aryl; each $R^5$ is independently chosen from halogen, hydroxyl, $C_{1-6}$ alkoxy and $C_{1-6}$ acyloxy; $R^6$ is a $C_{2-30}$ unsaturated linking group moiety; d=0 to 2; d'=0 to 3; e=1 to 3; e'=0 to 3; d+e=3; and d'+e'=3. Each $R^4$ is preferably chosen from $C_{1-10}$ alkyl or $C_{6-20}$ aryl. Each $R^5$ is preferably chosen from hydroxyl, $C_{1-6}$ alkoxy and $C_{1-6}$ acyloxy, more preferably from hydroxyl and $C_{1-6}$ alkoxy, and yet more preferably from $C_{1-6}$ alkoxy. It is preferred that $R^6$ is chosen from: an unsubstituted $C_{2-30}$ unsaturated aliphatic moiety, which may optionally contain one or more non-condensable silicon-containing moieties; a $C_{2-30}$ unsaturated aliphatic moiety which may optionally contain one or more non-condensable silicon-containing moieties, substituted with one or more of halo, cyano, $C_{1-10}$ alkyl, $C_{2-10}$ alkenyl, $C_{2-10}$ alkynyl, $C_{1-10}$ alkoxy, $C_{1-10}$ acyl, $C_{1-10}$ acyloxy, $C_{5-20}$ aryl, and $C_{5-20}$ aryloxy; one or more $C_{5-30}$ aryl moieties; and combinations thereof. More preferably, $R^6$ is chosen from an unsubstituted $C_{2-20}$ unsaturated aliphatic moiety or a $C_{2-20}$ unsaturated aliphatic moiety substituted with one or more of halo, cyano, $C_{1-10}$ alkyl, $C_{2-10}$ alkenyl, $C_{2-10}$ alkynyl, $C_{1-10}$ alkoxy, $C_{1-10}$ acyl, $C_{1-10}$ acyloxy, and $C_{5-20}$ aryl, and yet more preferably is an unsubstituted $C_{2-20}$ unsaturated aliphatic moiety. Alternatively, it is preferred that $R^6$ is chosen from a substituted or unsubstituted $C_{2-20}$ alkenyl or a substituted or unsubstituted $C_{2-20}$ alkynyl, more preferably an unsubstituted $C_{2-20}$ alkenyl or unsubstituted $C_{2-20}$ alkynyl, and even more preferably unsubstituted $C_{2-20}$ alkenyl. As used herein to refer to $R^6$, "substituted $C_{2-20}$ alkenyl" and "substituted $C_{2-20}$ alkynyl" refer to any $C_{2-20}$ alkenyl and $C_{2-20}$ alkynyl, respectively, having one or more of its hydrogens replaced with one or more substituents chosen from $C_{1-10}$ alkoxy, $C_{1-10}$ acyl, $C_{1-10}$ acyloxy, $C_{5-20}$ aryl, and $C_{5-20}$ aryloxy. Preferably, d=0 or 1, and more preferably d=0. It is preferred that d'=0 to 2, and more preferably d'=0. Preferably, e=2 to 3, and more preferably e=3. It is preferred that e'=1 to 3, and more preferably e'=2 or 3. It is preferred that d=0 and d'=0. It is further preferred that, e=3 and e'=3.

Exemplary second silane monomers are 1,2-bis (trimethoxysilypethylene; 1,2-bis (triethoxysilyl)ethylene; 1,4-bis(trimethoxysilyl)but-2-ene; 1,4-bis(triethoxysilyl)but-2-ene; 1,4-bis(trimethoxysilyl)-1,3-butadiene; 1,4-bis (triethoxysilyl)-1,3-butadiene; 1,4-bis(2-(trimethoxysilyl) vinyl)benzene; 1,4-bis(2-(triethoxysilyl)vinyl)benzene; 1,4-bis(2-(triacetoxysilyl)vinyl)benzene; 1,2-bis(2-(trimethoxysilyl)vinyl)benzene; 1,2-bis(2-(triethoxysilyl) vinyl)benzene; 1,1-bis(trimethoxysilyl)ethylene; 1,1-bis (triethoxysilyl)ethylene; 2-(trimethoxysilyl)methyl-3-trimethoxysilyl-propene; 1,2-bis(trimethoxysilylphenyl) ethylene; 1,2-bis (triethoxysilylphenyl)ethylene; 1,5-bis (trimethylsilyl)-3-phenyl-penta-1,4-diene; 1,5-bis (triethylsilyl)-3-phenyl-penta-1,4-diene; 1,5-bis (trimethylsilyl)-penta-1,4-diene; 1,5-bis(triethylsilyl)-penta-1,4-diene; 2,5-bis(trimethylsilyl)-hex-3-ene; 2,5-bis(triethylsilyl)-hex-3-ene; 4,4'-bis (trimethoxysilyl)biphenyl; 1,4-bis (trimethoxysilyl)benzene; 9,10-bis (trimethylsilyl) anthracene; bis(trimethoxysilyl)naphthalene; 1,4-bis (trimethoxysilyl)-2-vinylbenzene; 1,4-bis (trimethoxysilylmethyl)benzene; bis(trimethoxysilylphenyl) methane; bis(4-(trimethoxysilyl)phenyl)methanone; bis-(trimethoxysilylpropyl)(methyl)(phenyl)silane; bis-(trimethoxysilylpropyl)(methyl)(vinyl)silane; and the like. Preferred second silane monomers are: 1,2-bis (trimethoxysilyl)ethylene; 1,2-bis (triethoxysilyl)ethlene; 1,4-bis (trimethoxysilyl)but-2-ene; 1,4-bis (triethoxysilyl)but-2-ene; 1,4-bis (trimethoxysilyl)-1,3-butadiene; 1,4-bis (triethoxysilyl)-1,3-butadiene; 1,4-bis(2-(trimethoxysilyl)vinyl)benzene; 1,4-bis(2-(triethoxysilyl)vinyl)benzene; 1,4-bis (2-(triacetoxysilyl)vinyl)benzene; 1,2-bis (2-(trimethoxysilyl)vinyl)benzene; 1,2-bis(2-(triethoxysilyl) vinyl)benzene; 1,1-bis (trimethoxysilyl)ethylene; 1,1-bis (triethoxysilyl)ethylene; 2-(trimethoxysilyl)methyl-3-trimethoxysilyl-propene; 1,2-bis(trimethoxysilyl)phenyl) ethylene; 1,2-bis (triethoxysilyl)phenyl)ethylene; 1,5-bis (trimethylsilyl)-3-phenyl-penta-1,4-diene; 1,5-bis (triethylsilyl)-3-phenyl-penta-1,4-diene; 1,5-bis (trimethylsilyl)-penta-1,4-diene; 1,5-bis(triethylsilyl)-penta-1,4-diene; 2,5-bis(trimethylsilyl)-hex-3-ene; 2,5-bis (triethylsilyl)-hex-3-ene; 4,4'-bis (trimethoxysilyl)biphenyl; 1,4-bis (trimethoxysilyl)benzene; bis-(trimethoxysilylpropyl)-(methyl)(phenyl)silane; and bis-(trimethoxysilylpropyl)(methyl)(vinyl)silane.

Third silane monomers useful in the present invention have a chromophore moiety and a condensable silicon-containing moiety. Preferably, the chromophore moiety is an unsubstituted or substituted $C_{5-30}$ aromatic moiety. As used herein, the term "chromophore moiety" refers to a moiety that absorbs actinic radiation (light) at the wavelength of interest, and more specifically absorbs actinic radiation at a wavelength of <400 nm, preferably at a wavelength of <300 nm, and more preferably at a wavelength of from 260 to 100 nm. Suitable chromophores are unsubstituted or substituted $C_{5-30}$ aromatic (or aryl) moieties having one or more aromatic rings. Such chromophore moieties are unsubstituted aromatic moieties, such as furyl, pyranyl, pyridyl, phenyl, benzyl, naphthyl, anthracenyl, benzophenone, and the like, or may be aromatic moieties substituted with one or more of fluorine, hydroxyl, $C_{1-10}$-alkyl, fluoro $C_{1-10}$-alkyl, $C_{2-10}$-alkenyl, $C_{2-10}$-alkynyl, and $C_{5-30}$-aryl, and preferably is unsubstituted or hydroxyl-substituted. Preferred chromophore moieties are chosen from furyl, pyranyl, pyridyl, phenyl, fluorophenyl, trifluoromethylphenyl, naphthyl, acenaphthyl, fluorenyl, carbazolyl, anthracenyl, phenanthryl, pyrenyl, coronenyl, tetracenyl, pentacenyl, tetraphenyl, benzotetracenyl, triphenylenyl, perylenyl, benzyl, phenethyl, 2-phenylethen-1-yl, tolyl, xylyl, styrenyl, vinylnaphthyl, vinylanthracenyl, dibenzothiophenyl, thioxanthonyl, indolyl, acridinyl, thienyl and benzophenonyl, and more preferably phenyl, naphthyl, anthracenyl, phenanthryl, and benzyl. Suitable third monomers are those of formula (3):

$$(Ch)_f(R^7)_g Si(R^8)_{4-(f+g)} \qquad (3)$$

wherein each Ch is a $C_{5-30}$ chromophore moiety; each $R^7$ is independently chosen from H, $C_{1-12}$ alkyl, $C_{2-12}$ alkenyl, and $C_{2-12}$ alkynyl; each $R^8$ is independently chosen from halogen, hydroxyl, $C_{1-6}$ alkoxy and $C_{1-6}$ acyloxy; f=1 to 3; and g=0 to 2. It is preferred that f=1 or 2, and more preferably 1. It is preferred that g=0 or 1, and more preferably 0. It is preferred that each $R^7$ is independently chosen from $C_{1-12}$ alkyl, $C_{2-12}$ alkenyl, and $C_{2-12}$ alkynyl, and more preferably from $C_{1-12}$ alkyl. Preferably, each $R^8$ is independently chosen from hydroxyl, $C_{1-6}$ alkoxy, and $C_{1-6}$ acyloxy, and more preferably hydroxyl and $C_{1-6}$ alkoxy.

Exemplary third silane monomers having a chromophore moiety include, without limitation, phenyl trimethoxysilane, phenyl triethoxysilane, phenyl triacetoxysilane, phenyl trihydroxysilane, diphenyl dimethoxysilane, diphenyl diethoxysilane, benzyl triethoxysilane, benzyl triethoxysilane, dibenzyl diethoxysilane, dibenzyl dimethoxysilane, anthracenyl trimethoxysilane, anthracenyl triethoxysilane, anthracenyl triacetoxysilane, phenanthracenyl trimethoxysilane, phenannthracenyl triethoxysilane, tolyl trimethoxysilane, tolyl triethoxysilane, ditolyl trimethoxysilane, ditolyl triethoxysilane, xylyl trimethoxysilane, xylyl triethoxysilane, methoxyphenyl trimethoxysilane, phenyl(4-trimethoxysilyl) phenyl)methanone, 2-phenylethyl trimethoxysilane, 2-phenylethen-1-yl trimethoxysilane, 2-phenylethyn-1-yl trimethoxysilane, 2-phenylethyn-1-yl triethoxysilane, 2-phenylacryloyl trimethoxysilane, 2-phenylacryloyl triethoxysilane, and the like. Preferred third silane monomers are phenyl trimethoxysilane, phenyl triethoxysilane, phenyl triacetoxysilane, phenyl trihydroxysilane, diphenyl dimethoxysilane, diphenyl diethoxysilane, benzyl triethoxysilane, benzyl triethoxysilane, dibenzyl diethoxysilane, dibenzyl dimethoxysilane, anthrancenyl trimethoxysilane, anthracenyl triethoxysilane, anthracenyl triacetoxysilane, phenanthracenyl trimethoxysilane, and phenanthracenyl triethoxysilane, and more preferably phenyl trimethoxysilane, phenyl triethoxysilane, phenyl triacetoxysilane, phenyl trihydroxysilane, diphenyl dimethoxysilane, diphenyl diethoxysilane, benzyl triethoxysilane, benzyl triethoxysilane, dibenzyl diethoxysilane, dibenzyl dimethoxysilane, thienyl-2-trimethoxysilane, thienyl-3-trimethoxysilane, anthrancenyl trimethoxysilane, anthracenyl triethoxysilane, and anthracenyl triacetoxysilane.

The present condensed organosiloxane polymers may be prepared using a range of amounts of each of the first, second and third silane monomers. In general, the present organosiloxane polymers, comprise: one or more first silane monomers having a $C_{2-20}$ unsaturated hydrocarbyl moiety and a condensable silicon-containing moiety as polymerized units in an amount of from 0.01 to 0.95 mol %, one or more second monomers having two or more silicon-containing moieties joined by a $C_{2-30}$ unsaturated linking group moiety wherein at least one of the silicon-containing moieties is a condensable silicon-containing moiety as polymerized units in an amount of from 0.1 to 0.95 mol %, and one or more third monomers having a chromophore moiety and a condensable silicon-containing moiety as polymerized units in an amount of from 0.01 to 0.75 mol %. Preferably, the organosiloxane polymers comprise the one or more first monomers as polymerized units in an amount of 0.1 to 0.95 mol %, and more preferably 0.1 to 0.3 mol %. The present organosiloxane polymers preferably comprise, as polymerized units, one or more second silane monomers in an amount of 0.3 to 0.9 mol %, and more preferably 0.4 to 0.8 mol %. It is preferred that the present organosiloxane polymers comprise, as polymerized units, one or more third silane monomers in an amount of 0.1 to 0.5 mol %, and more preferably 0.1 to 0.3 mol %.

Preferred organosiloxane polymers of the invention are those of formula (4):

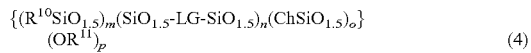

$$\{(R^{10}SiO_{1.5})_m(SiO_{1.5}\text{-}LG\text{-}SiO_{1.5})_n(ChSiO_{1.5})_o\}(OR^{11})_p \quad (4)$$

wherein $R^{10}$ is a $C_{2\text{-}20}$ unsaturated hydrocarbyl moiety; each $R^{11}$ is independently H, $C_{1\text{-}6}$ alkyl, or $C_{1\text{-}6}$ acyl; LG is a $C_{2\text{-}30}$ unsaturated linking group moiety; Ch is a $C_{5\text{-}30}$ chromophore moiety having one or more aromatic rings; $0.01 \le m \le 0.95$; $0.1 \le n \le 0.95$; $0.01 \le o \le 0.75$; $0.01 \le p \le 0.99$; and $m+n+o=1$. Preferably, $0.1 \le m \le 0.75$, and more preferably $0.1 \le m \le 0.5$. It is preferred that $0.1 \le o \le 0.5$, and more preferably $0.1 \le o \le 0.3$. Preferably, $0.2 \le n \le 0.9$, and more preferably $0.3 \le n \le 0.8$. It is preferred that each LG is independently chosen from: an unsubstituted $C_{2\text{-}30}$ unsaturated aliphatic moiety, which may optionally contain one or more non-condensable silicon-containing moieties; a $C_{2\text{-}30}$ unsaturated aliphatic moiety which may optionally contain one or more non-condensable silicon-containing moieties, substituted with one or more of halo, cyano, $C_{1\text{-}10}$ alkyl, $C_{2\text{-}10}$ alkenyl, $C_{2\text{-}10}$ alkynyl, $C_{1\text{-}10}$ alkoxy, $C_{1\text{-}10}$ acyl, $C_{1\text{-}10}$ acyloxy, $C_{5\text{-}20}$ aryl, and $C_{5\text{-}20}$ aryloxy; one or more $C_{5\text{-}30}$ aryl moieties; and combinations thereof. More preferably, each LG is independently an unsubstituted $C_{2\text{-}12}$ unsaturated aliphatic moiety or a $C_{2\text{-}12}$ unsaturated aliphatic moiety substituted with one or more of halo, cyano, $C_{1\text{-}10}$ alkyl, $C_{2\text{-}10}$ alkenyl, $C_{2\text{-}10}$ alkynyl, $C_{2\text{-}10}$ alkoxy, $C_{1\text{-}10}$ acyl, $C_{1\text{-}10}$ acyloxy, $C_{5\text{-}20}$ aryl, and $C_{5\text{-}20}$ aryloxy, and more preferably an unsubstituted $C_{2\text{-}12}$ unsaturated aliphatic moiety. Yet more preferably, each LG is independently a substituted or unsubstituted $C_{2\text{-}12}$ alkenyl or $C_{2\text{-}12}$ alkynyl, even more preferably an unsubstituted $C_{2\text{-}12}$ alkenyl or $C_{2\text{-}12}$ alkynyl, and still more preferably $C_{2\text{-}12}$ alkenyl. Preferably each $R^{10}$ is independently chosen from an unsubstituted $C_{2\text{-}12}$ unsaturated aliphatic moiety, a substituted $C_{2\text{-}12}$ unsaturated aliphatic moiety, and L-$C_{2\text{-}12}$ unsubstituted aliphatic, wherein L is a divalent linking group chosen from —C(=O)—, —C(=O)O—, and —O—C(=O)—, and yet more preferably is an unsubstituted $C_{2\text{-}12}$ unsaturated aliphatic moiety. Suitable Ch groups are those described above for the third silane monomer. Preferably each Ch is independently chosen from furyl, pyryl, thienyl, pyridyl, phenyl, fluorophenyl, trifluoromethylphenyl, naphthyl, acenaphthyl, fluorenyl, carbazolyl, anthracenyl, phenanthryl, pyrenyl, coronenyl, tetracenyl, pentacenyl, tetraphenyl, benzotetracenyl, triphenylenyl, perylenyl, benzyl, phenethyl, tolyl, xylyl, styrenyl, vinylnaphthyl, vinylanthracenyl, dibenzothiophenyl, thioxanthonyl, indolyl, benzophenonyl, and acridinyl, and more preferably phenyl, naphthyl, anthracenyl, phenanthryl, and benzyl. It is preferred that each $R^{11}$ is independently H or $C_{1\text{-}6}$ alkyl.

The present condensed organosiloxane polymers may optionally comprise as polymerized units one or more additional condensable silane monomers, such as those of formula (5):

$$Si(R^{12})_w(R^{13})_{4-w} \quad (5)$$

wherein each $R^{12}$ is independently chosen from H and $C_{1\text{-}6}$ alkyl; each $R^{13}$ is independently chosen from halogen, hydroxy, $C_{1\text{-}6}$ alkoxy, and $C_{1\text{-}6}$ acyloxy; and w=0-3. Preferably, each $R^{12}$ is chosen H and $C_{1\text{-}6}$ alkyl, and more preferably $C_{1\text{-}6}$ alkyl. It is preferred that each $R^{13}$ is chosen from hydroxy, $C_{1\text{-}6}$ alkoxy, and $C_{1\text{-}6}$ acyloxy, more preferably from hydroxy and $C_{1\text{-}6}$ alkoxy, and yet more preferably $C_{1\text{-}6}$ alkoxy. Preferably w=0 to 2, and more preferably 0 or 1. It is preferred that the present condensed organosiloxane polymers are free of additional condensable silane monomers of formula (5) as polymerized units, and more preferably free of additional condensable silane monomers as polymerized units.

Methods of preparing the present organosiloxane polymers are well-known in the art and any suitable method may be used to prepare the present organosiloxane polymers, which have a backbone comprising Si—O linkages. In general, the monomers used to form the present silicon-containing polymers are reacted with water, preferably in the presence of a catalyst which may be either acidic or basic, and optionally in the presence of one or more organic solvents. Preferably, an acid catalyst is used. Such reaction is carried out at a suitable reaction temperature. The monomers may be mixed together first, or may be separately added to the reaction vessel. The amount of water used is well-known to those skilled in the art, and is preferably from 0.5 to 2 equivalents relative to each hydrolyzable moiety present in the silane monomers, and more preferably from 0.75 to 1.5 equivalents, although greater or lesser amounts of water may be used. Suitable reaction temperatures for forming the present organosiloxane polymers are from 0 to 130° C., and preferably from 5 to 120° C. Suitable acid catalysts include mineral acids, carboxylic acids, and sulfonic acids such as alkanesulfonic acids and arylsulfonic acids. Exemplary acid catalysts include, but are not limited to: hydrofluoric acid, hydrochloric acid, hydrobromic acid, sulfuric acid, nitric acid, perchloric acid, phosphoric acid, acetic acid, propionic acid, butanoic acid, oxalic acid, malonic acid, trifluoroacetic acid, trichloroacetic acid, methanesulfonic acid, trifluoromethanesulfonic acid, ethanesulfonic acid, propanesulfonic acid, benzenesulfonic acid, toluenesulfonic acid, and phenolsulfonic acid, and preferably acetic acid, butanoic acid, toluenesulfonic acid, trifluoromethanesulfonic acid, and hydrochloric acid. Suitable basic catalysts are well-known to those skilled in the art. In general, the amount of such acid catalyst ranges from 0 to 1 equivalent relative to the silane monomers, preferably from 0.05 to 0.9, and more preferably from 0.05 to 0.75 equivalents.

A wide variety of optional organic solvents may be used in the preparation of the present organosiloxane polymers, such as alcohols, ketones, esters, ethers, aromatic hydrocarbons, alkanes, lactones, and the like. Exemplary organic solvents include, without limitation, methanol, ethanol, 1-propanol, 2-propanol, 1-butanol, 2-butanol, 2-methyl-1-propanol, 4-methyl-2-pentanol, ethylene glycol, propylene glycol, acetone, acetonitrile, tetrahydrofuran, toluene, hexane, ethyl acetate, ethyl lactate, cyclohexane, methyl-2-n-amyl ketone, butanediol monomethyl ether, propylene glycol monomethyl ether (PGME), propylene glycol monoethyl ether (PGEE), ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl-3-methoxypropionate, ethyl-3-ethoxypropionate, tert-butyl acetate, tert-butyl propionate, propylene glycol mono-tert-butyl ether acetate, gamma-butyrolactone, and mixtures thereof. The amount of such optional organic solvent is from 0 to 80%, and preferably from 10 to 50%, relative to the total weight of the silane monomers.

Suitable organosiloxane polymers of the invention have a $M_w$ of from 1000 to 60000 Da, preferably from 2000 to 40000 Da, and more preferably from 3000 to 35000 Da. The present organosiloxane polymers may be used as is or may be further purified by any suitable means known in the art.

Compositions comprising the present organosiloxane polymers may be prepared by combining the organosiloxane polymers with one or more organic solvents. A variety of organic solvents and water may optionally be used in the present compositions, provided that such solvent dissolves the components of the composition. Organic solvents may be used alone or a mixture of organic solvents may be used. Suitable organic solvents include, but are not limited to; ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol methyl ether (PGME), propylene glycol ethyl ether (PGEE), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate (EL), methyl hydroxyisobutyrate (HBM), ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as gamma-butyrolactone; and any combination of the foregoing. Preferred solvents are PGME, PGEE, PGMEA, EL, HBM, and combinations thereof.

The present compositions may comprise one or more optional components, such as coating enhancers, one or more stabilizers for the organosiloxane polymer, and such other additives as may be known in the art. The amount of such optional components used in the present compositions is well within the ability of those skilled in the art.

Coating enhancers are optionally added to the present compositions to improve the quality of a film or layer of the composition that is coated on a substrate. Such coating enhancers may function as plasticizers, surface leveling agents, and the like. Such coating enhancers are well-known to those skilled in the art, and are generally commercially available. Exemplary coating enhancers are: relatively long chain alkanols such as octanol, decanol, oleyl alcohol, cetyl alcohol, and the like; glycols such as tripropylene glycol, tetraethylene glycol, and the like; and surfactants. While any suitable surfactant may be used as a coating enhancer, such surfactants are typically non-ionic. Exemplary non-ionic surfactants are those containing an alkyleneoxy linkage, such as ethyleneoxy, propyleneoxy, or a combination of ethyleneoxy and propyleneoxy linkages. It is preferred that one or more coating enhancers are used in the present compositions. The coating enhancers are typically used in the present compositions in an amount of 0 to 10 wt % based on the weight of solvent, preferably from 0.01 to 5 wt %, and more preferably from 0.02 to 2 wt %.

One or more organosiloxane polymer stabilizers may optionally be added to the present compositions. Such stabilizers are useful for preventing unwanted hydrolysis or condensation of the organosiloxane polymers during storage. A variety of such stabilizers are known, and preferably the silicon-containing polymer stabilizer is an acid. Suitable acid stabilizers for the siloxane polymers include, without limitation, carboxylic acids, carboxylic acid anhydrides, mineral acids, and the like. Exemplary stabilizers include acetic acid, oxalic acid, malonic acid, malonic anhydride, malic acid, maleic acid, maleic anhydride, fumaric acid, citraconic acid, glutaric acid, glutaric anhydride, adipic acid, succinic acid, succinic anhydride, phthalic acid, and nitric acid. Such stabilizers are used in an amount of 0 to 20% of total solids, preferably from 0.1 to 15% of total solids, more preferably from 0.5 to 10% of total solids, and yet more preferably from 1 to 10% of total solids.

The present compositions may be coated on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15 to 90 seconds to obtain a desired layer of the organosiloxane polymer on the substrate. It will be appreciated by those skilled in the art that the thickness of the polymer mixture layer may be adjusted by changing the spin speed, as well as the solids content of the composition.

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated.

After being coated on the substrate, the present organosiloxane polymer layer is optionally soft-baked at a relatively low temperature to remove any solvent and other relatively volatile components from the underlayer. Typically, the substrate is baked at a temperature of ≤200° C., preferably from 100 to 200° C., and more preferably from 100 to 150° C. The baking time is typically from 10 seconds to 10 minutes, preferably from 30 seconds to 5 minutes, and more preferably from 60 to 90 seconds. When the substrate is a wafer, such baking step may be performed by heating the wafer on a hot plate. Such soft-baking step may be performed as part of the curing of the silicon-containing polymer, or may be omitted altogether.

The organosiloxane polymer layer is then cured to form a siloxane antireflective layer (or siloxane underlayer). The organosiloxane polymer is sufficiently cured such that the film does not intermix with a subsequently applied organic layer, such as a photoresist or other organic layer disposed directly on the resulting siloxane antireflective layer, while still maintaining the desired antireflective properties (n and k values) and etch selectivity of the siloxane antireflective layer. The organosiloxane polymer layer may be cured in an oxygen-containing atmosphere, such as air, or in an inert atmosphere, such as nitrogen and under conditions, such as heating, sufficient to provide a cured siloxane antireflective layer. This curing step is conducted preferably on a hot plate-style apparatus, although oven curing may be used to obtain equivalent results. Typically, such curing is performed by heating the organosiloxane polymer layer at a curing temperature of ≤350° C., and preferably 200 to 250° C. Alternatively, a two-step curing process or a ramped temperature curing process may be used. Such two-step and ramped temperature curing conditions are well-known to those skilled in the art. The curing temperature selected should be sufficient for any thermal acid generator used to liberate acid to aid in curing of the silicon-containing polymer film. The curing time may be from 10 seconds to 10 minutes, preferably from 30 seconds to 5 minutes, more preferably from 45 seconds to 5 minutes, and yet more preferably from 45 to 90 seconds. The choice of final curing temperature depends mainly upon the desired curing rate, with higher curing temperatures requiring shorter curing times. Following this curing step, the resulting siloxane antireflective layer surface may optionally be passivated by treatment with a passivating agent such as a disilazane compound, such as hexamethyldisilazane, or by a dehydration bake step to remove any adsorbed water. Such passivating treatment with a disilazane compound is typically performed at 120° C.

The siloxane underlayer formed from the present compositions typically has a refractive index (n value) in the range of 1.7 to 2, preferably 1.75 to 1.95, and more preferably 1.8 to 1.9, and an extinction coefficient (or optical absorption) (k value) in the range of 0.2 to 0.5, preferably 0.25 to 0.5, and more preferably 0.3 to 0.4, at a wavelength of 193 nm. The present siloxane underlayer has a water contact angle of <75°, preferably <70°, and more preferably a water contact angle in the range of 40° to 60°, as measured using a Kruss DSA-100 contact angle goniometer. Typically, the siloxane underlayer has a thickness of from 5 to 25 nm, preferably from 5 to 20 nm, more preferably from 8 to 20 nm, and even more preferably from 10 to 20 nm After curing of the organosiloxane polymer layer to form a siloxane underlayer, one or more processing layers, such as photoresists, hardmask layers, bottom antireflective coating (or BARC) layers, and the like, may be disposed on the siloxane underlayer. For example, a photoresist layer may be disposed, such as by spin coating, directly on the surface of the siloxane underlayer. Alternatively, a BARC layer may be coated directly on the siloxane underlayer, followed by curing of the BARC layer, and coating a photoresist layer directly on the cured BARC layer. In another alternative, an organic underlayer such as a carbon-based hardmask layer, is first coated on a substrate and cured, a layer of an organosiloxane polymer of the invention is then coated on the cured organic underlayer, the organosiloxane polymer layer is then cured to form a siloxane underlayer, an optional BARC layer may be coated directly on the siloxane underlayer, followed by curing of the optional BARC layer, and coating a photoresist layer directly on the cured BARC layer. A wide variety of photoresists may be suitably used, such as those used in 193 nm lithography, such as those sold under the EPiC™ brand available from Dow Electronic Materials (Marlborough, Mass.). Suitable photoresists may be either positive tone development or negative tone development resists, or may be conventional negative resists. The photoresist layer is then imaged (exposed) using patterned actinic radiation, and the exposed photoresist layer is then developed using the appropriate developer to provide a patterned photoresist layer. The pattern is next transferred from the photoresist layer to any optional BARC layer, and then to the siloxane underlayer by an appropriate etching technique, such as dry etching with an appropriate plasma. Typically, the photoresist is also removed during such etching step. Next, the pattern is transferred to any organic underlayer present using an appropriate technique, such as dry etching with $O_2$ plasma, and then to the substrate as appropriate. The pattern is next transferred from the organic underlayer to the substrate. The siloxane antireflective layer is removed concurrently with the step of transferring of the pattern from the organic underlayer to the substrate. The electronic device substrate is then further processed according to conventional means.

Figure 2:
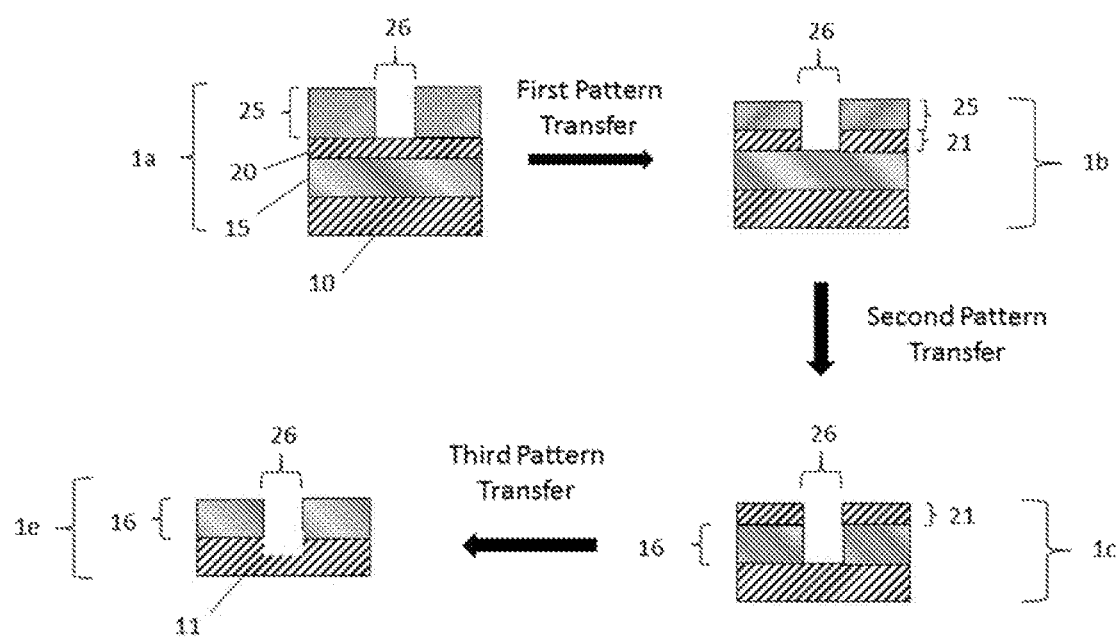
FIG. 2 is a cross-sectional illustration of certain steps of the trilayer process of the invention.

FIG. 2 illustrates a trilayer process according to the invention, where structure 1a is a device cross-section, not to scale, showing, in order, patterned photoresist layer 25 having opening 26 disposed on siloxane antireflective layer 20, which is disposed on a high carbon-content antireflective coating layer 15, which is disposed on semiconductor device substrate 10. Structure 1a is subjected to a first pattern transfer step such as a fluorine etch step, in which opening 26 is transferred to the siloxane antireflective layer to provide patterned siloxane antireflective layer 21 as shown in structure 1b. Next, structure 1c is obtained by subjecting structure 1b to a second pattern transfer step such as an oxide etch to transfer opening 26 into the high carbon-content antireflective coating layer to provide patterned high carbon-content antireflective coating layer 16 with the removal of patterned photoresist layer 25. A third pattern transfer step is used to transfer opening 26 into substrate 11 with the concurrent removal of patterned siloxane antireflective layer 21 as shown in structure 1d, eliminating the need for a separate step to remove the siloxane antireflective layer.

EXAMPLE 1

To phenyltrimethoxysilane (PTMS, 12.7 g), vinyltrimethoxysilane (VTMS, 4.75 g), bis(triethoxysilyl)ethylene (BSE, 83.5 g) and isopropanol (80 g) was added HCl 0.1 N (0.265 g) in water (29.45 g) and isopropanol (80 g) over 10 min and stirred an additional 50 minutes. The reaction mixture was heated to 69° C. for 24 hours, cooled to room temperature, diluted with PGEE (300 g) and the volatiles were removed under reduced pressure. The concentration of the mixture was adjusted to 10 wt % solids via addition of PGEE to afford a clear solution with molecular weight of 27,100 relative to polystyrene standard.

COMPARATIVE EXAMPLE 1

To phenyltrimethoxysilane (PTMS, 17.8 g) and vinyltrimethoxysilane (VTMS, 53.2 g) was added HCl 0.1N (0.195 g) in water (24.3 g) over 10 min and stirred an additional 50 minutes. The reaction mixture was heated to 69° C. for 18 hours, cooled to room temperature, diluted with PGEE (300 g) and the volatiles were removed under reduced pressure. The concentration of the mixture was adjusted to 10 wt % solids via addition of PGEE to afford a clear solution with molecular weight of 1200 relative to polystyrene standard.

EXAMPLE 2

To phenyltrimethoxysilane (PTMS, 6.35 g), vinyltrimethoxysilane (VTMS, 9.50 g), bis(triethoxysilyl)ethylene (BSE, 83.5 g) and isopropanol (80 g) was added HCl 0.1N (0.265 g) in water (29.5 g) and isopropanol (80 g) over 10 min and stirred an additional 50 minutes. The reaction mixture was heated to 69° C. for 18 hours, cooled to room temperature, diluted with PGEE (300 g) and the volatiles were removed under reduced pressure. The concentration of the mixture was adjusted to 10 wt % solids via addition of PGEE to afford a clear solution with molecular weight of 19,300 relative to polystyrene standard.

COMPARATIVE EXAMPLE 2

To phenyltrimethoxysilane (PTMS, 6.35 g), vinyltrimethoxysilane (VTMS, 9.50 g), bis(triethoxysilyl)ethane (BTESE, 84.1 g) and isopropanol (160 g) was added HCl 0.1N (0.265 g) in water (29.5 g) over 10 min and stirred an additional 50 minutes. The reaction mixture was heated to 69° C. for 18 hours, cooled to room temperature, diluted with PGEE (300 g) and the volatiles were removed under reduced pressure. The concentration of the mixture was adjusted to 10 wt % solids via addition of PGEE to afford a clear solution with molecular weight of 800 relative to polystyrene standard.

COMPARATIVE EXAMPLE 3

To phenyltrimethoxysilane (PTMS, 6.35 g), ethyltrimethoxysilane (ETMS, 2.40 g), bis(triethoxysilyl)ethylene (BSE, 41.8 g) and isopropanol (80 g) was added HCl0.1N (1.32 g) in water (14.7 g) over 10 min and stirred an additional 50 minutes. The reaction mixture was heated to 69° C. for 18 hours, cooled to room temperature, diluted with PGEE (150 g) and the volatiles were removed under reduced pressure. The concentration of the mixture was adjusted to 10 wt % solids via addition of PGEE to afford a clear solution with molecular weight of 46,300 relative to polystyrene standard.

FORMULATION EXAMPLE 1

The following components were combined: 2.83 g of the polymer from Example 1 as component 1; 0.76 g of a 0.1 wt % solution of tetrabutylammonium chloride in PGEE as component 2; 10.7 g of PGEE as component 3; and 14.9 g of ethyl lactate as component 4. The mixture was filtered through 0.2 μm polytetrafluoroethylene syringe to provide Formulation 1.

FORMULATION EXAMPLES

The procedure of Formulation Example 1 was repeated to prepare Formulation Example 2 and Comparative Formulation Examples 1 to 3 using the components and amounts reported in Table 1. In Table 1, Component 1 refers to the polymer added to each formulation, Component 2 is 0.1 wt % solution of tetrabutylammonium chloride in PGEE, Component 3 is PGEE, Component 4 is ethyl lactate and Component 5 is 2-hydroxyisobutyric acid methyl ester.

TABLE 1

| Formulation | Component 1 (g) | Amount of Component 2 (g) | Amount of Component 3 (g) | Amount of Component 4 (g) | Amount of Component 5 (g) |
|---|---|---|---|---|---|
| Formulation Example 2 | Example 2 (4.71) | (0.159) | (18.0) | — | (24.6) |
| Comparative Formulation Example 1 | Comparative Example 1 (4.64) | (0.127) | (11.2) | (17.1) | — |
| Comparative Formulation Example 2 | Comparative Example 2 (9.43) | (0.254) | — | (3.77) | (33.4) |
| Comparative Formulation Example 3 | Comparative Example 3 (4.64) | (0.123) | (11.2) | (17.1) | — |

EXAMPLE 3: FILM EVALUATION

Coated films of Formulation Examples 1 and 2, and Comparative Formulations 1 to 3 were obtained by spin coating using either a TEL Clean Track ACT-8 or a TEL Clean Track Lithius coater. Coated films were cured at 240° C. for 60 seconds on either 200 mm or 300 mm silicon wafers. The film thickness of the coated films was determined using a Therma-Wave 7 spectroscopic ellipsometer. Poor coating quality indicated the presence of severe striations. After curing, films became insoluble in organic solvents, such as PGMEA and n-butyl acetate, and in aqueous tetramethylammonium hydroxide solution. Film evaluation data are reported in Table 2.

Optical constants (n and k) were determined using a Woollam WVASE32 vacuum ultraviolet variable angle spectroscopic ellipsometer. Optical constant data was collected to cover 180-900 nm using a range of 1.4 to 6.875 eV in increments of 0.0375 eV and three incident angles of 65, 70, and 75 degrees. Static water contact angle was determined by measuring the contact angle of distilled, deionized water at 1 μL drop size using a Kruss DSA-100 contact angle goniometer.

Pattern collapse margin (PCM) for Comparative Formulation 1 was determined by 193 nm lithography at 0.75 NA using a TEL Clean Track ACT-8 tool for coating, baking and developing and an ASML5500/1100 193 nm scanner for exposure of a 90 nm dense line and space pattern. Substrates were prepared for exposure by coating the following stack on 200 mm bare silicon: 100 nm of an underlayer prepared from a cross-linked 1-napthol-formaldehyde polymer cured at 240° C./60 seconds, 17 nm of a silicon hardmask of the present invention cured at 240° C./60 seconds, further treated with exposure to hexamethyldisilazane vapor at 150° C./30 seconds, and 100 nm of a 193 nm resist baked at 90° C. for 60 seconds after coating and baked at 90° C. for 60 seconds after exposure. After exposure, the resist was developed using n-butyl acetate. Developed resist patterns were inspected using Hitachi S-9380 CD-SEM for pattern fidelity. Good PCM was indicated by the presence of standing resist lines with no sign of adhesion failure at a measured CD greater than 90 nm. Bad PCM was indicated by the absence of standing resist lines at a measured CD of 90 nm.

PCM for Formulation Example 1 was determined by 193 nm lithography at 1.35 NA using a TEL Clean Track Lithius tool for coating, baking and developing and an ASML5500/1900i 193 nm immersion scanner for exposure of a 45 nm dense line and space pattern. Substrates were prepared for exposure by coating the following stack on 300 mm bare silicon: 80 nm of an underlayer prepared from a cross-linked 1-napthol-formaldehyde polymer cured at 240° C./60 seconds, 17 nm of a silicon hardmask of the present invention cured at 240° C./60 seconds, further treated with exposure to hexamethyldisilazane vapor at 150° C./30 seconds, and 70 nm of a 193 nm resist baked at 90° C. for 60 seconds after coating and baked at 90° C. for 60 seconds after exposure. After exposure, the resist was developed using n-butyl acetate. Developed resist patterns were inspected using Hitachi S-9380 CD-SEM for pattern fidelity. Good PCM was indicated by the presence of standing resist lines with no sign of adhesion failure at a measured CD greater than 45 nm. Bad PCM was indicated by the absence of standing resist lines at a measured CD of 45 nm.

TABLE 2

| Example | Coating Quality | Film Thickness | 193 nm n | 193 nm k | Water Contact Angle | PCM 0.75 NA | PCM 1.35 NA |
|---|---|---|---|---|---|---|---|
| Comparative Formulation 1 | Good | 17 nm | 1.81 | 0.44 | 91° | Bad | — |
| Comparative Formulation 2 | Poor | — | — | — | — | — | — |
| Comparative Formulation 3 | Good | 17 nm | 1.83 | 0.36 | 53° | — | — |
| Formulation Example 1 | Good | 17 nm | 1.78 | 0.38 | 56° | Good | — |
| Formulation Example 2 | Good | 17 nm | 1.76 | 0.31 | 51° | — | — |

What is claimed is:

1. An organosiloxane polymer comprising as polymerized units: one or more first silane monomers having a $C_{2-20}$ unsaturated hydrocarbyl moiety and a condensable silicon-containing moiety; one or more second silane monomers having two or more silicon-containing moieties joined by a $C_{2-30}$ unsaturated linking group moiety, wherein the $C_{2-30}$ unsaturated linking group moiety has carbon-carbon unsaturation, wherein the carbon-carbon unsaturation is non-aromatic unsaturation, or both aromatic unsaturation and non-aromatic unsaturation, and wherein at least one of the silicon-containing moieties is a condensable silicon-containing moiety; and one or more third silane monomers having a chromophore moiety and a condensable silicon-containing moiety.

2. The organosiloxane polymer of claim 1 wherein the chromophore moiety is an unsubstituted or substituted $C_{5-30}$ aromatic moiety.

3. The organosiloxane polymer of claim 2 wherein the chromophore moiety is chosen from furyl, pyryl, pyridyl, phenyl, fluorophenyl, trifluoromethylphenyl, naphthyl, acenaphthyl, fluorenyl, carbazolyl, anthracenyl, phenanthryl, pyrenyl, coronenyl, tetracenyl, pentacenyl, tetraphenyl, benzotetracenyl, triphenylenyl, perylenyl, benzyl, phenethyl, tolyl, xylyl, styrenyl, vinylnaphthyl, vinylanthracenyl, dibenzothiophenyl, thioxanthonyl, indolyl, thienyl, benzophenonyl, and acridinyl.

4. The organosiloxane polymer of claim 1 wherein the unsaturated linking group moiety is chosen from an unsubstituted $C_{2-12}$ unsaturated aliphatic moiety and a $C_{2-12}$ unsaturated aliphatic moiety substituted with one or more of halo, cyano, $C_{1-10}$ alkyl, $C_{2-10}$ alkenyl, $C_{2-10}$ alkynyl, $C_{1-10}$ alkoxy, $C_{1-10}$ acyl, $C_{1-10}$ acyloxy, $C_{5-20}$ aryl, and $C_{5-20}$ aryloxy.

5. The organosiloxane polymer of claim 1 wherein the $C_{2-20}$ unsaturated hydrocarbyl moiety is selected from an unsubstituted $C_{2-15}$ unsaturated aliphatic moiety having from 0 to 3 heteroatoms chosen from oxygen and nitrogen or a $C_{2-15}$ unsaturated aliphatic moiety having from 0 to 3 heteroatoms chosen from oxygen and nitrogen and being substituted with one or more substituents chosen from halo, cyano, $C_{1-10}$ alkoxy, $C_{1-10}$ acyl, and $C_{1-10}$ aryloxy, and L-$C_{2-20}$ unsubstituted aliphatic, wherein L is a divalent linking group chosen from —C(=O)—, —C(=O)O—, and —O—C(=O)—.

6. A composition comprising the organosiloxane polymer of claim 1 and one or more organic solvents.

7. An organosiloxane polymer of formula (4):

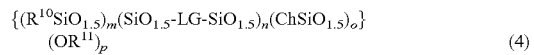

$$\{(R^{10}SiO_{1.5})_m(SiO_{1.5}\text{-LG-}SiO_{1.5})_n(ChSiO_{1.5})_o\}(OR^{11})_p \quad (4)$$

wherein $R^{10}$ is a $C_{2-20}$ unsaturated hydrocarbyl moiety; each $R^{11}$ group is independently H, $C_{1-6}$ alkyl, or $C_{1-6}$ acyl; LG is a $C_{2-30}$ unsaturated linking group moiety; Ch is a $C_{5-30}$ chromophore moiety having one or more aromatic rings; $0.01 \leq m \leq 0.75$; $0.2 \leq n \leq 0.95$; $0.01 \leq o \leq 0.75$; $0.01 \leq p \leq 0.99$; and $m+n+o=1$.

8. The organosiloxane polymer of claim 7 wherein each LG is independently chosen from: an unsubstituted $C_{2-30}$ unsaturated aliphatic moiety, which may optionally contain one or more non-condensable silicon-containing moieties; a $C_{2-30}$ unsaturated aliphatic moiety which may optionally contain one or more non-condensable silicon-containing moieties, substituted with one or more of halo, cyano, $C_{1-10}$ alkyl, $C_{2-10}$ alkenyl, $C_{2-10}$ alkynyl, $C_{1-10}$ alkoxy, $C_{1-10}$ acyl, $C_{1-10}$ acyloxy, $C_{5-20}$ aryl, and $C_{5-20}$ aryloxy; one or more $C_{5-30}$ aryl moieties; and combinations thereof.

9. The organosiloxane polymer of claim 7 wherein Ch is an unsubstituted or substituted $C_{5-30}$ aromatic moiety.

10. The organosiloxane polymer of claim 7 wherein each $R^{10}$ is independently substituted or unsubstituted $C_{2-12}$ alkenyl or $C_{2-12}$ alkynyl.

11. A composition comprising the organosiloxane polymer of claim 7 and one or more organic solvents.

* * * * *